(12) United States Patent
Okazaki et al.

(10) Patent No.: US 6,849,858 B2
(45) Date of Patent: Feb. 1, 2005

(54) APPARATUS AND METHOD FOR FORMING ALIGNMENT LAYERS

(75) Inventors: Nobuo Okazaki, Shiga-Ken (JP);
Yasuhiko Shiota, Shiga-Ken (JP); Johji Nakagaki, Shiga-Ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,202

(22) Filed: Jul. 1, 2003

(65) Prior Publication Data

US 2005/0001177 A1 Jan. 6, 2005

(51) Int. Cl.[7] .............................. G21G 5/00; G03F 9/00; G03C 5/00
(52) U.S. Cl. ................... 250/492.3; 430/5; 430/296
(58) Field of Search .................. 250/492.3; 310/12; 355/67; 430/5, 296

(56) References Cited

U.S. PATENT DOCUMENTS

| | | | | |
|---|---|---|---|---|
| 5,952,155 A | * | 9/1999 | Sakakibara et al. | 430/296 |
| 6,614,033 B2 | * | 9/2003 | Suguro et al. | 250/491.1 |
| 6,633,366 B2 | * | 10/2003 | de Jager et al. | 355/67 |
| 6,720,680 B1 | * | 4/2004 | Tanaka | 310/12 |

* cited by examiner

*Primary Examiner*—John R. Lee
*Assistant Examiner*—Paul M. Gurzo
(74) *Attorney, Agent, or Firm*—H. Daniel Schnurmann

(57) ABSTRACT

An object of the present invention is to provide an apparatus and method for ensuring a uniform orientation of liquid crystal molecules of an alignment layer by irradiation with ion beams. An apparatus of the present invention comprises a grid 11a having a plurality of ion ejection holes 30 of various sizes. The size of the ion ejection hole 30 varies depending on an ion density. The size of the ion ejection hole 30 increases with decrease in the ion density.

12 Claims, 5 Drawing Sheets

APPARATUS AND METHOD FOR FORMING ALIGNMENT LAYERS

BACKGROUND OF INVENTION

The present invention relates to an apparatus and method for forming a liquid crystal alignment layer by irradiation with ion beams or atomic beams.

In a liquid crystal display (LCD), an alignment layer is provided so as to orient liquid crystal molecules. It is known that a liquid crystal alignment layer is formed by irradiating a thin film of polyimide or inorganic material with ion beams. By breaking interatomic bonds in the thin film with ion beams, an alignment film is formed.

It is needed that liquid crystal molecules are oriented uniformly all over the alignment layer. If the liquid crystal molecules are not uniformly oriented, a liquid crystal panel suffers from an unevenness of brightness and color. In order to produce an enhanced-definition liquid crystal panel, it is required to ensure much higher degree of uniformity in orientation of liquid crystal molecules than a conventional liquid crystal panel.

In order to achieve uniform orientation of liquid crystal molecules, it is necessary to ensure uniform density distribution of ion beams ejected from an ion source. Uniform density of ion beams has been so far been ensured by controlling the densities of gas and free electrons in a plasma generation chamber. However, it is apparent from various experiments that the density control is not an easy task.

As shown in FIGS. 5(a) and 5(b), while a glass substrate 24 is being moved at a constant speed, a surface of a thin film 26 is irradiated with ion beams 28 to effectively orient liquid crystal molecules. In order to orient the liquid crystal molecules of a whole surface of a thin film 26 in one direction, it is ideal that ion beams parallel to each other are applied to the thin film 26.

An ion source for generating ion beams 28 comprises a plurality of plate-like objects 11c made of electrically conductive material, as shown in FIG. 6. Such plate-like object will be hereinafter referred to as a "grid" in this specification. The grid 11c has a plurality of ion ejection holes 30 of uniform size.

However, the ion beams 28 ejected from the ion ejection holes 30 of the grid 11c are spread in various directions. In order to cut unnecessary ion beams, a mask 20 with a slit 22 is provided above the substrate 24 with the thin film 26 applied thereon. In other words, only the ion beams 28 selected for forming an alignment layer are irradiated to the thin film 26. However, if the intensity distribution of ion beams is not uniform in Y direction shown in FIG. 5(b), uniform orientation of liquid crystal molecules on the surface of the thin film 26 cannot be achieved.

Accordingly, it is an object of the present invention to provide an apparatus and method for ensuring a uniform orientation of liquid crystal molecules of an alignment layer by irradiation with ion beams.

SUMMARY OF INVENTION

An apparatus for forming an alignment layer according to the present invention comprises an ion source for applying ion beams to a thin film on a substrate, and the ion source comprises a grid having a plurality of ion ejection holes of various sizes. The size of the ejection hole varies depending on the ion density. The apparatus of the present invention can ensure a uniform density of ion beams and uniform orientation of liquid crystal molecules.

Alternatively, the grid may have ejection holes of uniform size but the number of ejection holes per unit area may be different. The number of ejection holes varies depending on the ion density. The apparatus with such grid can also ensure a uniform density of ion beams and uniform orientation of liquid crystal molecules.

A method for forming an alignment layer according to the present invention comprises the steps of: generating ion beams by an ion source; making an intensity of the ion beams uniform depending on an ion density of the ion source; and applying the ion beams to a thin film on the substrate. The step of making an intensity of the ion beams uniform includes making an intensity of the ion beams by changing the size and/or density of the ejection holes of an plate-like object of the ion source. The size of an ejection hole in a higher ion density portion is smaller than that of an ejection hole in a lower density portion, and/or the number of ejection holes per unit in a higher ion density portion is fewer than that in a lower ion density portion.

The present invention can achieve a uniform intensity distribution of ion beams and uniform orientation of liquid crystal molecules on an alignment layer. Therefore, the present invention makes it possible to produce a liquid crystal display with no unevenness in brightness and color.

DETAILED DESCRIPTION

Embodiments of an apparatus and method for forming an alignment layer according to the present invention will be hereinafter described with reference to the accompanying drawings.

Figure 1A:
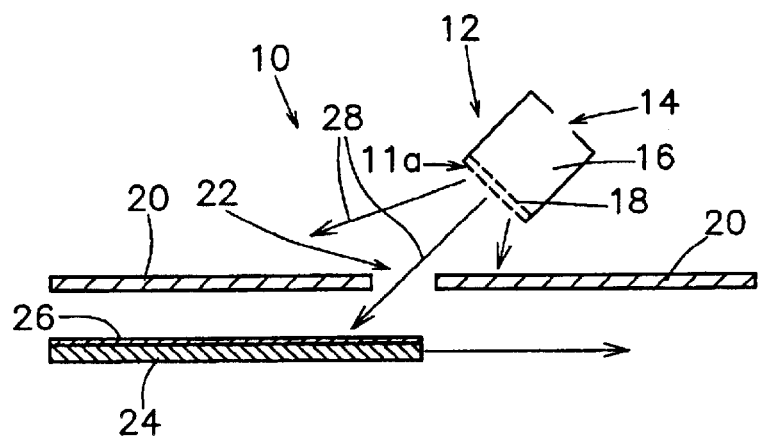
FIGS. 1(a) and 1(b) are a side view and a top view of an apparatus for forming an alignment layer according to the present invention, respectively.
Figure 1B:
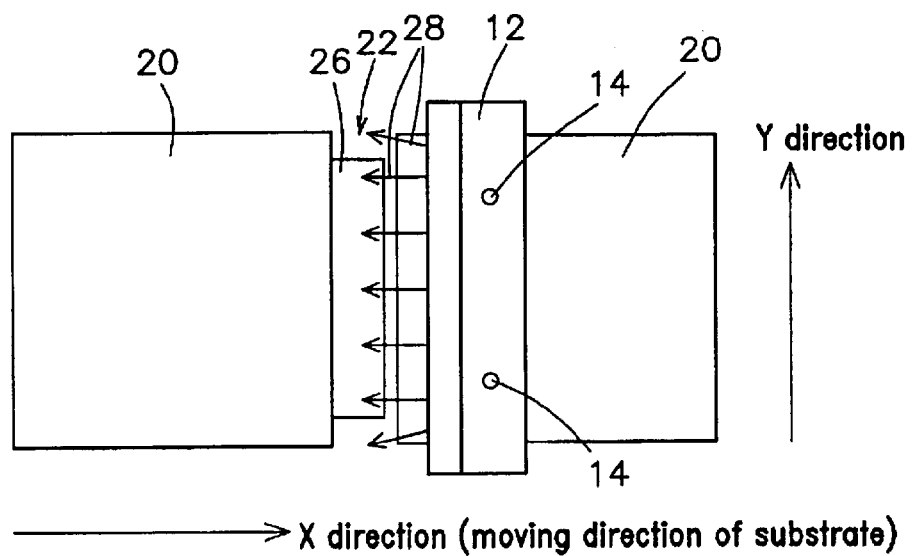

In an apparatus for forming an alignment layer according to the present invention, a mask 20 is provided between an ion source 12 and a glass substrate 24 with a thin film 26 applied thereon, as shown in FIGS. 1(a) and 1(b). The mask 20 has a slit 22. The apparatus for forming an alignment layer comprises a stage (not shown) for moving the glass substrate 24. A grid 11a of the ion source 12 has a plurality of ion ejection holes 30, as shown in FIG. 3.

The ion source 12 comprises a plasma generation chamber 16, a gas inlet 14 for introducing gas into the plasma generation chamber 16, an accelerating electrode 18 for accelerating ions generated in the plasma generation chamber 16, and a grid 11a for ejecting the accelerated ions to the outside. The gas is argon (Ar) gas, for example. When the argon gas is used, argon ions (Ar+) are generated in the plasma generation chamber 16.

Figure 2:
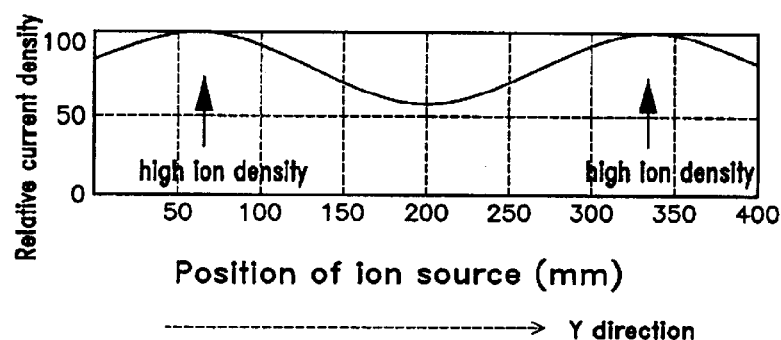
FIG. 2 is a graph showing ion density distribution in the Y direction at an ion source.

There will be described the ejection holes 30 provided to the grid 11a. The ion intensity distribution in the Y direction shown in FIG. 1(b) varies depending on an amount of plasma generated in the plasma generation chamber 16. FIG. 2 shows an ion intensity distribution of the ion source having two gas inlets. In FIG. 2, the ion intensity is expressed as relative current density. The ion density increases with the ion intensity. In FIG. 2, a horizontal axis represents the position of the ion source 12 of FIGS. 1(a) and 1(b) in the Y direction. There are various causes of unevenness of the ion density shown in FIG. 2. For example, one of the causes is the position of the gas inlet. Even if the number of gas inlet is increased, even if the gas inlet is slit-shaped, or even if the flow rate of gas is adjusted, the ion intensity distribution does not become uniform due to various other causes. Thus, the structure of the gas inlet becomes complicated, but uniform ion intensity distribution cannot be ensured.

Figure 3:
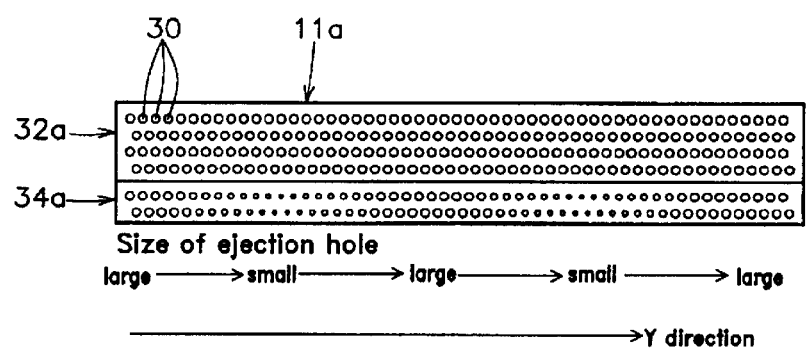
FIG. 3 shows a grid to be used in an apparatus for forming an alignment layer according to the present invention.

To solve this problem, there are provided to the grid 11a a plurality of ejection holes 30 of different sizes, as shown in FIG. 3. The size of the ejection hole 30 varies depending on the ion density of each portion of the grid 11a. The size of the ejection hole 30 increases with decrease of the ion density. Therefore, the smallest ejection holes 30 are provided at a portion where the ion density is the highest, while the largest ejection holes 30 are provided at a portion where the ion density is the lowest. The ejection hole 30 can be of any shape such as round, oval, and polygon.

As obvious from the ion intensity distribution shown in FIG. 2, the ejection holes 30 are small in size at a high current density portion while they are large at a low current density portion. Therefore, the intensity distribution of ion beams becomes uniform. For example, the maximum diameter of the ejection hole 30 is 3 mm and the minimum diameter is 2.5 mm.

The orientation of a certain point on the thin film 26 depends on the direction of the last ion beam 28 applied to that point. Therefore, it is not always necessary to change the sizes of the ejection holes 30 all over the grid 11a.

The grid 11a comprises an area 34a having ejection holes 30 of different sizes and an area 32a having ejection holes 30 of uniform size. These two areas 32a and 34a are arranged in parallel with the longitudinal direction of the slit 22 (in the Y direction in FIG. 1(b)). The area 34a having ejection holes 30 of different sizes is provided on a rear side relative to the moving direction of the substrate 24, or on a side on which the last ion beam is applied. In FIGS. 1(a) and 1(b), the area 34a is provided on the right side of the grid 11a.

In this method for forming an alignment layer, the substrate 24 with a thin film 26 such as polyimide film formed thereon is placed on a stage. While the stage is being moved, the ion beams 28 are applied to the thin film 26 through the slit 22. The ion beams 28 are ejected from the ejection holes 30. The ion beams 28 breaks interatomic bonds in the thin film 26 and thus an alignment layer is formed.

The main point of the present invention may be summarized in that the size of the ejection hole 30 varies depending on the ion density at each portion on the grid 11a. In other words, the size of the ejection hole 30 is smaller at higher ion density portion while it is larger at lower ion density portion. Thus, a uniform density of the ion beams 28 from the ion source 12 can be achieved.

The aforementioned ejection holes 30 of various sizes are not necessarily formed all over the grid 11a, but they are formed only on a rear side relative to the moving direction of the substrate 24 or on a side on which the last ion beam is applied.

The ion beams 28 are concentrically spread from the respective ejection holes of the ion source 12. The most in number of ion beams is the one that is normal to the grid 11a. The number of ion beams are concentrically reduced. The ion beams 28 include the ones having a Y direction component whose orbit is as shown in FIG. 1(b), namely the ones that are applied to the substrate 24 at a certain angle to the moving direction.

In the area 34a having the ejection holes 30 of various sizes, uniform ion intensity in the Y direction shown in FIG. 1(b) can be achieved. Under this condition, regardless of degree of spread of ion beams 28, the most in number of ion beams that are applied to a certain point on the substrate 24 is the one that does not have Y direction component whose orbit is as shown in FIG. 1(b). In other words, the ion beams that are normal to the grid of the ion source 12 exert the greatest influence on the orientation of the liquid crystal molecules at every point on the substrate 24, and thus more uniform orientation can be achieved.

Figure 4:
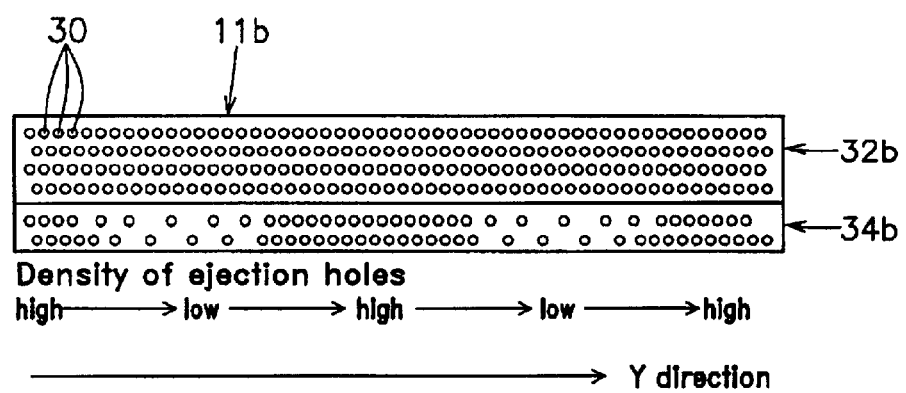
FIG. 4 shows another grid to be used in an apparatus for forming an alignment layer according to the present invention.
Figure 5A:
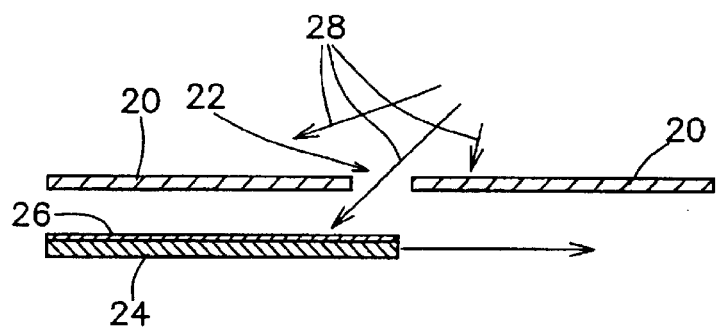
FIGS. 5(a) and 5(b) are a side view and a top view showing the formation of an alignment layer, respectively.
Figure 5B:
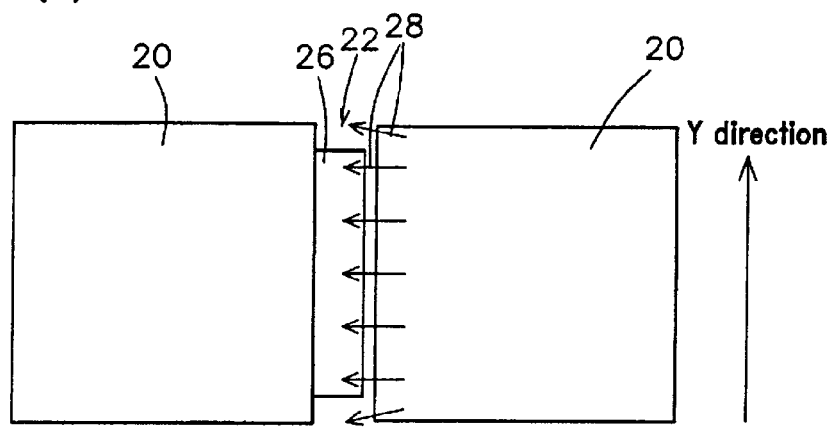
Figure 6:
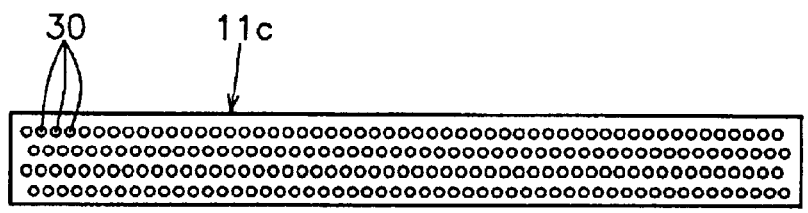
FIG. 6 shows a grid to be used in a conventional apparatus for forming an alignment layer.

If the ion intensity distribution is not uniform in the Y direction, the ion beams that exert the greatest influence on the orientation of the liquid crystal molecules may often not be the ion beams that are normal to the grid but random ion beams that form a certain angle to the x axis. intensity of the ion beams can also be achieved by other means than providing the ejection holes 30 of various sizes. As shown in FIG. 4, the ejection holes 30 are of uniform size, but the number of ejection holes 30 per unit area may vary.

The number of the ejection holes 30 varies depending on the ion density at each position of the grid 11b. As the ion intensity decreases, the number of the ejection holes 30 per unit area increases. The grid 11b comprises an area 34b having different numbers of ejection holes 30 per unit area and an area 32b having the same number of ejection holes 30 per unit area. These two areas 32b and 34b are arranged in parallel with the longitudinal direction of the slit 22. The area 34b having different numbers of ejection holes 30 per unit area is provided on a rear side relative to the moving direction of the substrate 24.

The number of the ejection holes 30 per unit area is, for example, 9 per square centimeter at the maximum and 6 per square centimeter at the minimum.

By changing the number and the density of the ejection holes 30, a uniform density of ion beams and uniform orientation of liquid crystal molecules can be achieved.

While the embodiments of the present invention have thus been described with reference to the drawings, it should be understood that the present invention be not limited to the embodiments. For example, in the aforementioned embodiments, the two areas 32a and 32b and the two areas 34a and 34b are provided to the grid 11a and 11b, respectively, however only one region 34a and 34b may be provided thereto.

There has thus been described the case where either one of the size or density of the ejection holes 30 is changed. However, both the size and density of the ejection holes 30 may be changed at the same time. The size and density of the ejection holes 30 are adjusted in such a manner to ensure uniform ion beams 28. the aforementioned embodiments, the ion beams 28 are applied to the thin film 26 from the ion source 12. However, usable beams are not limited to the ion beams 28, but atomic beams may be used. The atomic beams are generated by accelerating ions to create the ion beams 28 and then neutralizing the ion beams 28, and applied to the thin film 26.

Many changes, modifications, variations and other uses and applications can be made to the embodiments on the basis of knowledge of those skilled in the art without departing from the scope of the present invention.

What is claimed is:

1. An apparatus for forming an alignment layer on a substrate of a liquid crystal display comprising:
an ion source for generating ion beams; and
a mask having a slit placed between said substrate and said ion source, wherein said ion source is provided with a plate-like object having a first area provided with ejection holes of different sizes, and a second area having ejection holes of uniform size, and wherein said first and second areas are arranged in parallel with said slit.

2. The apparatus according to claim 1, wherein the size of said ion ejection holes varies in accordance to the ion density.

3. The apparatus according to claim 2, wherein ejection holes in a higher ion density portion of said plate-like object are smaller in size than the size of the ejection holes in a lower ion density portion of said plate-like object.

4. The apparatus according to claim 1, wherein said plate-like object is provided with areas of high ion density alternating with areas of low ion density.

5. The apparatus according to claim 4, wherein said alternating areas of high ion density are comprised of ejection holes having a smaller size than the ejection holes in said low ion density of said plate-like object.

6. The apparatus according to claim 1, further comprising a stage for moving said substrate, wherein said area with ejection holes of different sizes is provided on the back side relative to the moving direction of said substrate.

7. An apparatus for forming an alignment layer on a substrate of a liquid crystal display comprising:
an ion source for generating ion beams; and
a mask having a slit and provided between the substrate and the ion source, wherein said ion source has a plate like object provided with a first area having different numbers of ejection holes per unit area, and a second area having the same number of ejection holes per unit area, said first and second areas being contiguous to each other and parallel to said slit.

8. The apparatus according to claim 7, wherein the number of said ion ejection holes varies depending on the ion density.

9. The apparatus according to claim 8, wherein a high ion density portion of said plate-like object has a lesser number of ejection holes per unit area than a low ion density portion of said plate-like object.

10. The apparatus according to claim 7, wherein said ion source is comprised of a plasma generation chamber, a gas inlet for introducing gas into said plasma generation chamber, an accelerating electrode for accelerating said ions in said plasma generation chamber and a grid for ejecting said accelerated ions to the outside.

11. The apparatus according to claim 7, wherein said ejection holes in said first and second areas are arranged in parallel with the longitudinal direction of said slit.

12. The apparatus according to claim 7, further comprising a stage for moving said substrate, said first and second areas having ejection holes of different sizes provided on the back side relative to the moving direction of the substrate.

* * * * *